(12) United States Patent
Iijima et al.

(10) Patent No.: US 11,631,598 B2
(45) Date of Patent: Apr. 18, 2023

(54) SUBSTRATE FIXING DEVICE

(71) Applicant: SHINKO ELECTRIC INDUSTRIES CO., LTD., Nagano (JP)

(72) Inventors: Nobuyuki Iijima, Nagano (JP);
Hiroyuki Asakawa, Nagano (JP);
Keiichi Takemoto, Nagano (JP); Yoichi Harayama, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 540 days.

(21) Appl. No.: 16/691,885

(22) Filed: Nov. 22, 2019

(65) Prior Publication Data
US 2020/0176282 A1 Jun. 4, 2020

(30) Foreign Application Priority Data
Nov. 30, 2018 (JP) .............................. JP2018-224483

(51) Int. Cl.
*H01L 21/67* (2006.01)
*H01L 21/683* (2006.01)
*H01L 21/673* (2006.01)

(52) U.S. Cl.
CPC ...... *H01L 21/67098* (2013.01); *H01L 21/673* (2013.01); *H01L 21/6833* (2013.01)

(58) Field of Classification Search
CPC ............. H01L 21/67098; H01L 21/673; H01L 21/6833; H01L 21/67103; H01L 21/67109; H01L 21/6831; H01L 21/68757; H01L 21/67069; H01L 21/6735; H02N 13/00
See application file for complete search history.

(56) References Cited

U.S. PATENT DOCUMENTS

| | | | |
|---|---|---|---|
| 6,538,872 B1 | 3/2003 | Wang et al. | |
| 9,343,346 B2 | 5/2016 | Kosakai et al. | |
| 2005/0215073 A1 | 9/2005 | Nakamura et al. | |
| 2009/0165956 A1 | 7/2009 | Nam | |
| 2011/0063771 A1* | 3/2011 | Nishioka | H01L 21/6833 361/234 |
| 2012/0299253 A1* | 11/2012 | Kosakai | H01L 21/6831 279/128 |
| 2019/0088517 A1 | 3/2019 | Kosakai et al. | |
| 2019/0393068 A1* | 12/2019 | Minemura | H01L 21/6833 |

FOREIGN PATENT DOCUMENTS

| | | |
|---|---|---|
| JP | H06-151322 | 5/1994 |
| JP | H10-112437 | 4/1998 |
| JP | 2001-102436 | 4/2001 |
| JP | 2005-277074 | 10/2005 |
| JP | 2014-078731 | 5/2014 |
| JP | 2017-163157 | 9/2017 |

OTHER PUBLICATIONS

Office Action dated Sep. 20, 2022 with respect to the corresponding Japanese patent application No.2018-224483.
Office Action dated Feb. 28, 2023 with respect to the corresponding Japanese patent application No. 2018-224483.

* cited by examiner

*Primary Examiner* — Edward Chin
(74) *Attorney, Agent, or Firm* — IPUSA, PLLC

(57) ABSTRACT

A substrate fixing device includes a baseplate, an insulating layer over the baseplate, and an electrostatic chuck on the insulating layer. The insulating layer includes a heating element and a metal layer. The metal layer has a higher thermal conductivity than the insulating layer and is positioned closer to the electrostatic chuck than the heating element.

12 Claims, 7 Drawing Sheets

SUBSTRATE FIXING DEVICE

CROSS-REFERENCE TO RELATED APPLICATION

This application is based upon and claims the benefit of priority of the prior Japanese Patent Application No. 2018-224483, filed on Nov. 30, 2018, the entire contents of which are incorporated herein by reference.

FIELD

A certain aspect of the embodiments discussed herein is related to substrate fixing devices.

BACKGROUND

Film deposition apparatuses (such as CVD apparatuses and PVD apparatuses) and plasma etching apparatuses used for manufacturing semiconductor devices such as ICs and LSIs include a stage for accurately holding a wafer in a vacuum process chamber.

As such a stage, for example, a substrate fixing device that attracts and holds a wafer that is an object of attraction using an electrostatic chuck mounted on a baseplate has been proposed.

Examples of substrate fixing devices include a substrate fixing device provided with a heating element for controlling wafer temperature. According to this substrate fixing device, the heating element is buried in an insulating layer provided next to an electrostatic chuck, for example. (See Japanese Laid-open Patent Publication No. 2014-78731.)

SUMMARY

According to an aspect of the present invention, a substrate fixing device includes a baseplate, an insulating layer over the baseplate, and an electrostatic chuck on the insulating layer. The insulating layer includes a heating element and a metal layer. The metal layer has a higher thermal conductivity than the insulating layer and is positioned closer to the electrostatic chuck than the heating element.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
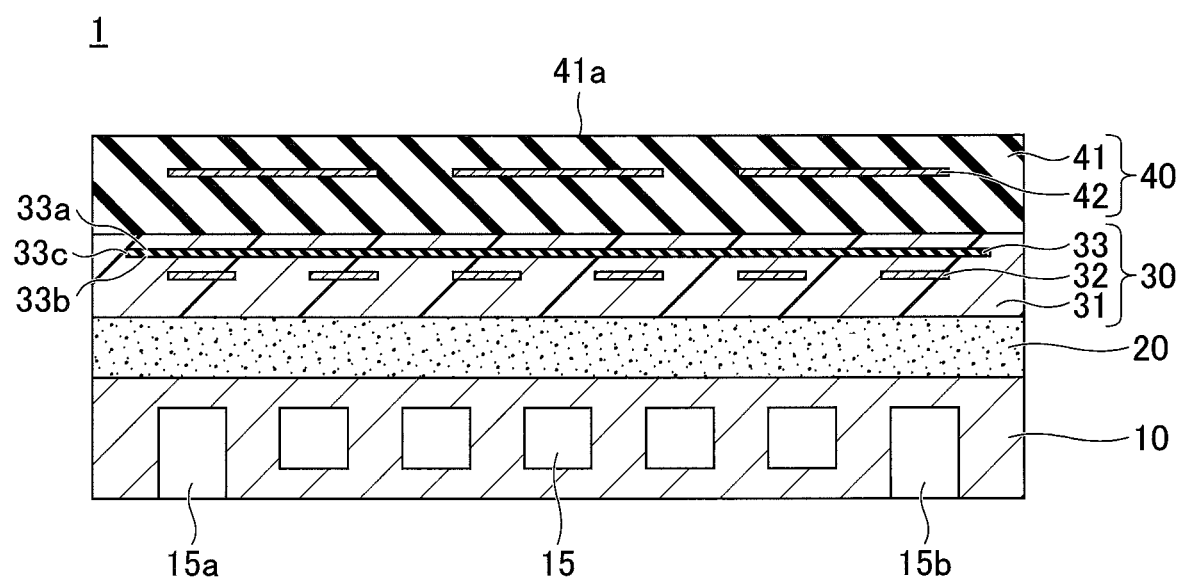
FIG. 1 is a schematic sectional view of a substrate fixing device according to an embodiment.

According to the substrate fixing device, however, variations in heat generation due to, for example, variations in the heating element in its thickness direction may impair the uniformity of the surface temperature of the electrostatic chuck.

According to an aspect of the present invention, a substrate fixing device with improved uniformity of the surface temperature of an electrostatic chuck is provided.

One or more preferred embodiments of the present invention will be explained with reference to accompanying drawings. In the following, the same elements or components are referred to using the same reference numeral, and duplicate description thereof may be omitted.

[Structure of Substrate Fixing Device]

FIG. 1 is a schematic sectional view of a substrate fixing device according to an embodiment. Referring to FIG. 1, a substrate fixing device 1 includes a baseplate 10, an adhesive layer 20, a heating part 30, and an electrostatic chuck 40. Hereinafter, a direction in which the heating part 30 and the electrostatic chuck 40 are successively stacked in order on the baseplate 10 through the adhesive layer 20 may be referred to as the "stacking direction" of the substrate fixing device 1.

The baseplate 10 is a member for mounting the electrostatic chuck 40. The thickness of the baseplate 10 may be, for example, approximately 20 mm to approximately 50 mm. The baseplate 10 is formed of, for example, aluminum, and may also be used as, for example, an electrode for controlling plasma. By feeding the baseplate 10 with predetermined high-frequency electric power, it is possible to control energy for causing, for example, generated ions in the state of plasma to collide with a wafer attracted onto the electrostatic chuck 40 to effectively perform etching.

A water conduit 15 is provided in the baseplate 10. The water conduit 15 includes a cooling water introduction part 15a at one end and a cooling water discharge part 15b at the other end. The water conduit 15 is connected to a cooling water controller (not depicted) provided outside the substrate fixing device 1. The cooling water controller introduces cooling water into the water conduit 15 from the cooling water introduction part 15a and discharges the cooling water from the cooling water discharge part 15b. By cooling the baseplate 10 by circulating cooling water through the water conduit 15, it is possible to cool a wafer attracted onto the electrostatic chuck 40. In addition to the water conduit 15, for example, a gas conduit for introducing an inert gas for cooling a wafer attracted onto the electrostatic chuck 40 may be provided in the baseplate 10.

The heating part 30 is firmly adhered onto the baseplate 10 through the adhesive layer 20. For example, a silicone adhesive may be used as the adhesive layer 20. The thickness of the adhesive layer 20 may be, for example, approximately 2 mm. The thermal conductivity of the adhesive layer 20 is preferably 2 W/mK or higher. The adhesive layer 20 may have a multilayer structure of stacked adhesive layers. For example, by providing the adhesive layer 20 with a two-layer structure by combining an adhesive having a high thermal conductivity and an adhesive having a low elastic modulus, it is possible to achieve a stress reduction effect to reduce stress generated from a difference in thermal expansion between the aluminum baseplate 10 and the electrostatic chuck 40.

The heating part 30 includes an insulating layer 31, a heating element 32 buried in the insulating layer 31, and a metal layer 33. The heating element 32 and the metal layer 33 are surrounded and covered by the insulating layer 33 to be protected from the outside.

Suitable materials for the insulating layer 31 include, for example, an epoxy resin and a bismaleimide-triazine resin having a high thermal conductivity and high heat resistance. The thermal conductivity of the insulating layer 31 is preferably 3 W/mK or higher. By including a filler such as alumina or aluminum nitride in the insulating layer 31, it is possible to improve the thermal conductivity of the insulating layer 31. The glass-transition temperature (Tg) of the insulating layer 31 is preferably 250° C. or higher. The thickness of the insulating layer 31 is preferably approximately 100 µm to approximately 150 µm. The thickness variation of the insulating layer 31 is preferably ±10% or less.

The heating element 32 generates heat with application of voltage from outside the substrate fixing device 1 to perform heating such that a placement surface 41a of a substrate 41 as described below has a predetermined temperature. For example, the heating element 32 can heat the placement surface 41a up to approximately 250° C. to approximately 300° C. Suitable materials for the heating element 32 include, for example, copper (Cu), tungsten (W), nickel (Ni), and constantan (a Cu—Ni—Mn—Fe alloy). The thickness of the heating element 32 may be, for example, approximately 20 µm to approximately 100 µm. The heating element 32 may have a concentric circle pattern, for example.

In order to improve the adhesion between the heating element 32 and the insulating layer 31 at high temperatures, at least one surface of the heating element 32, namely, one or both of an upper surface and a lower surface of the heating element 32, are preferably roughened. In the case of roughening both the upper and lower surfaces of the heating element 32, the roughening method may differ between the upper surface and the lower surface. The roughening method may be, but is not limited in particular to, for example, etching, surface modification using a coupling agent, or dot processing using a UV-YAG laser at a wavelength of 355 nm or less.

In the insulating layer 31, the metal layer 33 is positioned closer to the electrostatic chuck 40 than is the heating element 32. That is, the metal layer 33 is positioned between the electrostatic chuck 40 and the heating element 32 in the stacking direction. The metal layer 33 is a layer that uniformizes and diffuses heat generated from the heating element 32, namely, a layer that reduces non-uniform heat generation, and is formed of a material having a higher thermal conductivity than the insulating layer 31. Suitable materials for the metal layer 33 include, for example, Cu, W, Ni, and constantan. The planar shape of the metal layer 33 may be, for example, a circle. In this case, the planar shape of the metal layer 33 may be smaller than the planar shape of the insulating layer 31. The thickness of the metal layer 33 may be, for example, approximately 20 µm to approximately 100 µm. The heating element 32 may be formed of the same material as the heating element 32. The planar shape of the metal layer 33 may be larger than the planar shape of the heating element 32. Here, a planar shape refers to the shape of an object as viewed in the stacking direction.

An upper surface 33a, a lower surface 33b, and a side surface 33c of the metal layer 33 are covered with the insulating layer 31. This prevents the side surface 33c of the metal layer 33 from being exposed to the outside and thus can improve the corrosion resistance of the metal layer 33 to a plasma gas.

The electrostatic chuck 40 is exposed to a plasma gas. Therefore, when the corrosion resistance to a plasma gas is low, a reaction product formed by components of the heating element 32 and the metal layer 33 and a plasma gas becomes particles, which adhere onto the substrate 41 to exert an adverse effect such as contamination. When the metal layer 33 and the heating element 32 are formed of the same material, a risk due to contamination can be reduced.

Figure 5A:
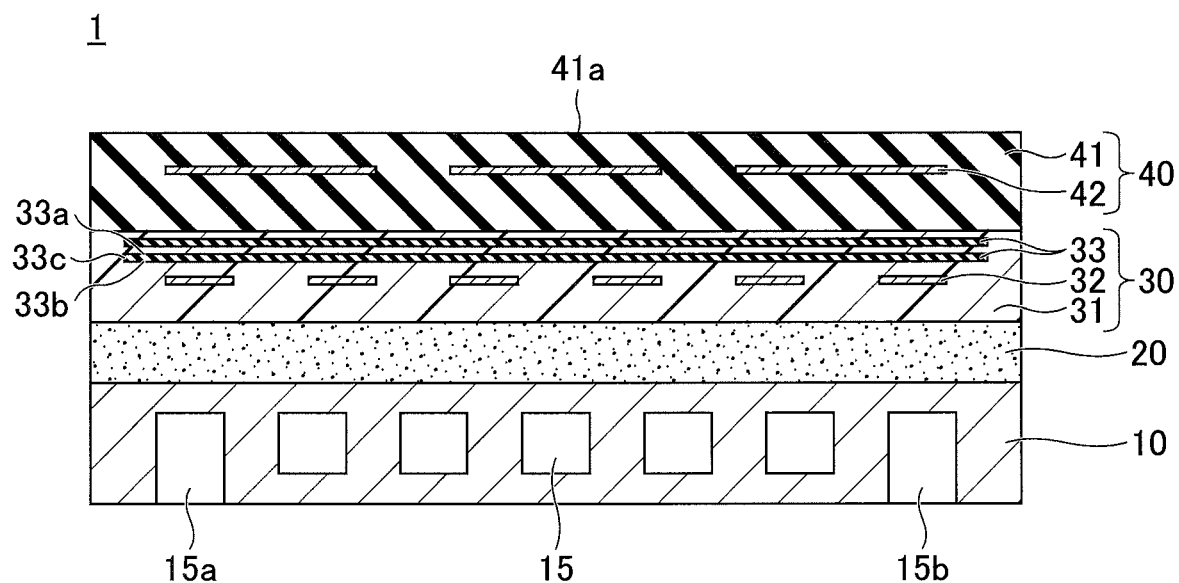
FIGS. 5A and 5B are schematic sectional views of the substrate fixing device, illustrating variations of the metal layer.
Figure 5B:
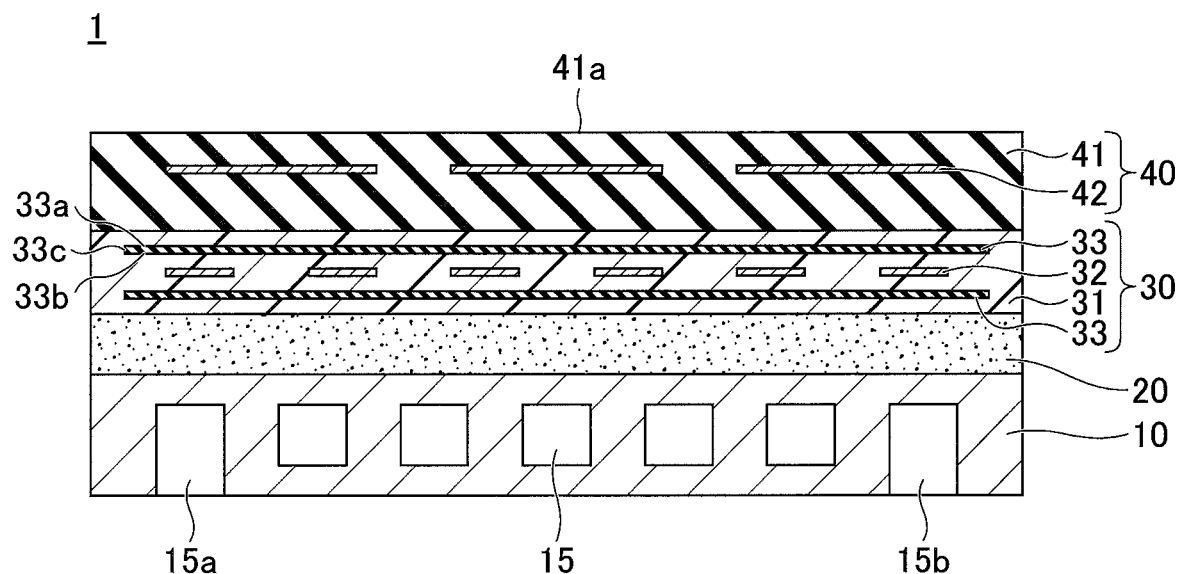

The metal layer 33 may be multiple layers spaced apart at predetermined intervals in the thickness direction of the insulating layer 31 in the insulating layer 31 as illustrated in FIG. 5A, for example. The number of metal layers 33 provided between the electrostatic chuck 40 and the heating element 32 is not limited to two as illustrated in FIG. 5A and may be more. Furthermore, the metal layer 33 may be provided at each of a position closer to the electrostatic chuck 40 and a position closer to the adhesive layer 20 (the baseplate 10) than is the heating element 32 in the insulating layer 31 as illustrated in FIG. 5B, for example. Furthermore, the configurations of FIGS. 5A and 5B may be combined. By providing multiple metal layers, it is possible to further improve heat diffusion.

The electrostatic chuck 40 is where a wafer that is an object of attraction is attracted and held. The planar shape of the electrostatic chuck 40 is, for example, a circle. A wafer that is an object of attraction may be, for example, approximately 8 in., approximately 12 in., or approximately 18 in. in diameter.

The electrostatic chuck 40 is provided on the heating part 30. The electrostatic chuck 40 includes the substrate 41 and an electrostatic electrode 42. The electrostatic chuck 40 is, for example, a Johnsen-Rahbek electrostatic chuck. Alternatively, the electrostatic chuck 40 may be a Coulombic electrostatic chuck.

The substrate 41 is a dielectric. Suitable materials for the substrate 41 include, for example, ceramics such as aluminum oxide ($Al_2O_3$) and aluminum nitride (AlN). The thickness of the substrate 41 may be, for example, approximately 1 mm to approximately 10 mm. The relative permittivity (at 1 kHz) of the substrate 41 may be, for example, approximately 9 to approximately 10. The electrostatic chuck 40 and the insulating layer 31 of the heating part 30 are directly bonded. By directly bonding the heating part 30 and the electrostatic chuck 40 without interposing an adhesive between the heating part 30 and the electrostatic chuck 40, it is possible to increase the heatproof temperature of the substrate fixing device 1. The heatproof temperature of conventional substrate fixing devices in which a heating part and an electrostatic chuck are bonded using an adhesive is approximately 150° C., while the heatproof temperature of the substrate fixing device 1 can be approximately 200° C.

The electrostatic electrode 42 is a thin-film electrode buried in the substrate 41. The electrostatic electrode 42 is connected to a power supply disposed outside the substrate fixing device 1. When a predetermined voltage is applied from the power supply to the electrostatic electrode 42, an electrostatic attraction force is generated between the electrostatic electrode 42 and a wafer. As a result, the wafer can be attracted and held onto the placement surface 41a of the substrate 41 of the electrostatic chuck 40. The attraction and holding force increases as the voltage applied to the electrostatic electrode 42 increases. The electrostatic electrode 42 may have either a monopolar shape or a bipolar shape. Suitable materials for the electrostatic electrode 42 include, for example, W and molybdenum (Mo).

[Method of Manufacturing Substrate Fixing Device]

FIGS. 2A through 2I are diagrams illustrating a process of manufacturing a substrate fixing device according to the embodiment. A description is given, with reference to FIGS. 2A through 2I, of a process of manufacturing the substrate fixing device 1, focusing on a process of forming the heating part 30. Compared with FIG. 1, FIGS. 2A through 2H are inverted in orientation.

Figure 2A:
FIGS. 2A through 2I are diagrams illustrating a process of manufacturing a substrate fixing device according to the embodiment.

First, in the process depicted in FIG. 2A, the electrostatic chuck 40 including the substrate 41 and the electrostatic electrode 42 buried in the substrate 41 is formed by a known manufacturing method that includes the process of forming a via in a green sheet, the process of filling the via with conductive paste, the process of forming a pattern to become an electrostatic electrode, the process of stacking another green sheet on the green sheet and performing firing, and the process of performing surface planarization. In order to increase adhesion to an insulating resin film 311 as described below, a surface of the electrostatic chuck 40 to be laminated with the insulating resin film 311 may be subjected to, for example, blasting to be roughened.

Figure 2B:
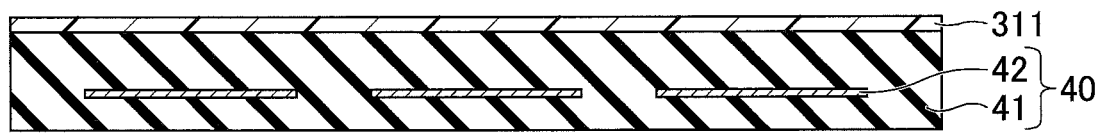

Next, in the process depicted in FIG. 2B, the electrostatic chuck 40 is directly laminated with the insulating resin film 311. It is preferable to laminate the electrostatic chuck 40 with the insulating resin film 311 in a vacuum in that it is possible to prevent inclusion of voids. The insulating resin film 311 is left semi-cured (in B-stage) without being completely cured. Because of the adhesive force of the semi-cured insulating resin film 311, the insulating resin film 311 is temporarily fixed onto the electrostatic chuck 40.

Suitable materials for the insulating resin film 311 include, for example, an epoxy resin and a bismaleimide-triazine resin having a high thermal conductivity and high heat resistance. The thermal conductivity of the insulating resin film 311 is preferably 3 W/mK or higher. By including a filler such as alumina or aluminum nitride in the insulating resin film 311, it is possible to improve the thermal conductivity of the insulating resin film 311. The glass-transition temperature of the insulating resin film 311 is preferably 250° C. or higher. In terms of increasing heat transfer performance (the rate of heat transfer), the thickness of the insulating resin film 311 is preferably approximately 60 μm or less, and the thickness variation of the insulating resin film 311 is preferably ±10% or less.

Figure 2C:
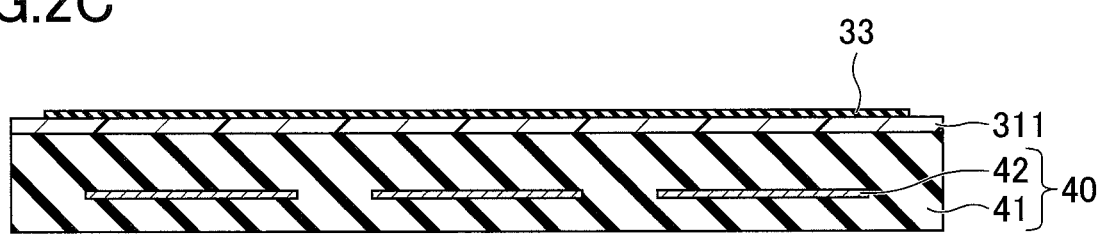

Next, in the process depicted in FIG. 2C, the metal layer 33 is placed on the insulating resin film 311. The metal layer 33 may be formed by laminating the insulating resin film 311 with metal foil of, for example, Cu, W, Ni, or constantan. The metal layer 33 may alternatively be formed by sputtering or plating, using any of the above-described materials. The planar shape and thickness of the metal layer 33 are as described above. Because of the adhesive force of the semi-cured insulating resin film 311, the metal layer 33 is temporarily fixed onto the insulating resin film 311.

Figure 2D:
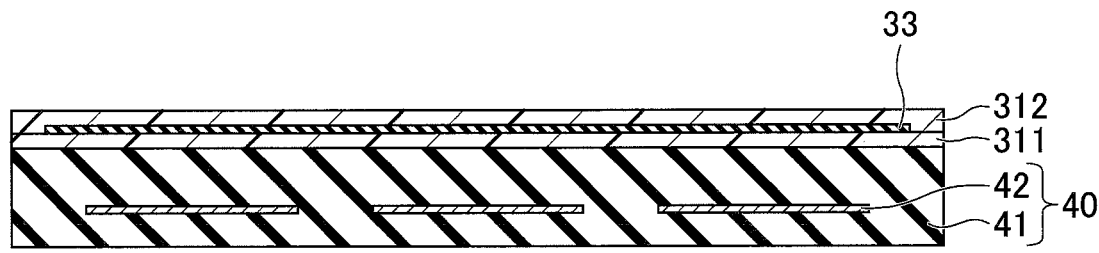

Next, in the process depicted in FIG. 2D, the insulating resin film 311 is laminated with an insulating resin film 312 that covers the metal layer 33. It is preferable to laminate the insulating resin film 311 with the insulating resin film 312 in a vacuum in that it is possible to prevent inclusion of voids. The material of the insulating resin film 312 may be the same as the material of the insulating resin film 311. The thickness of the insulating resin film 312, however, which may be suitably determined within a range that makes it possible to cover the metal layer 33, does not necessarily have to be the same as the thickness of the insulating resin film 311.

Figure 2E:
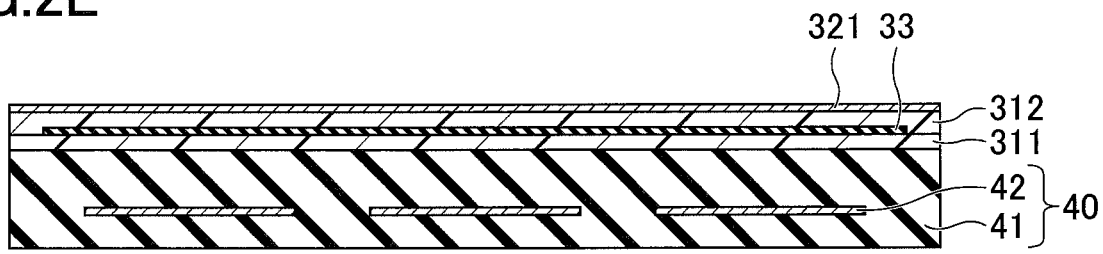

Next, in the process depicted in FIG. 2E, metal foil 321 is placed on the insulating resin film 312. The metal foil 321 is a layer to ultimately become the heating element 32. Therefore, the material of the metal foil 321 is the same as the material of the heating element 32 as illustrated above. In view of the formability of a pattern by etching, the thickness of the metal foil 321 is preferably 100 μm or less. Because of the adhesive force of the semi-cured insulating resin film 312, the metal foil 321 is temporarily fixed onto the insulating resin film 312.

Before placement of the metal foil 321 on the insulating resin film 312, it is preferable to roughen at least one surface (one or both of the upper and the lower surface) of the metal foil 321. In the case of roughening both the upper and the lower surface of the metal foil 321, the roughening method may differ between the upper and the lower surface. The roughening method may be, but is not limited in particular to, for example, etching, surface modification using a coupling agent, or dot processing using a UV-YAG laser at a wavelength of 355 nm or less.

According to dot processing, it is possible to selectively roughen a region of the metal foil 321 that requires roughening. Therefore, in the case of using dot processing, there is no need to roughen the entire region of the metal foil 321, and it is sufficient to roughen at least a region of the metal foil 321 to be left as the heating element 32 (that is, there is no need to go so far as to roughen a region of the metal foil 321 to be removed by etching).

Figure 2F:
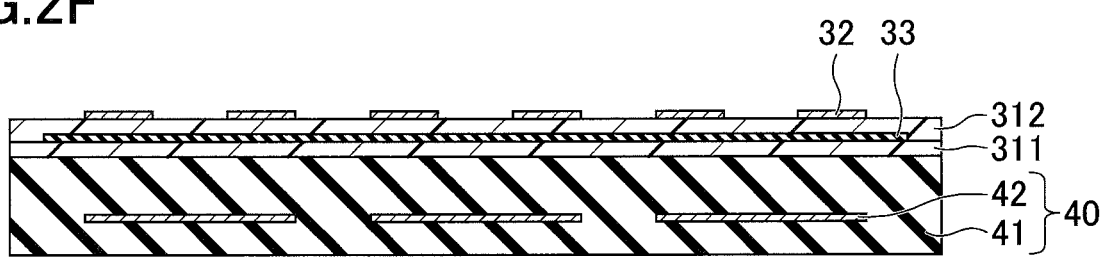

Next, in the process depicted in FIG. 2F, the metal foil 321 is patterned to form the heating element 32. The heating element 32 may be formed in, for example, a concentric circle pattern. Specifically, for example, a resist is formed on the entire surface of the metal foil 321, and is exposed to light and developed to form a resist pattern that covers only part of the metal foil 321 to be left as the heating element 32. Next, part of the metal foil 321 that is not covered with the resist pattern is removed by etching. For example, when the material of the metal foil 321 is Cu, a copper chloride etchant or a ferric chloride etchant may be used as an etchant to remove the metal foil 321.

Thereafter, the resist pattern is stripped, using a stripping solution, to form the heating element 32 at a predetermined position on the insulating resin film 312 (photolithography). By forming the heating element 32 by photolithography, it is possible to reduce variations in the size of the heating element 32 in its width direction to improve the distribution of generated heat. The heating element 32 formed by etching may have, for example, a substantially trapezoidal sectional shape. In this case, the difference in wiring width between opposite surfaces of the heating element 32 of which one contacts the insulating resin film 312 may be, for example, approximately 10 μm to approximately 50 μm. By causing the heating element 32 to have a simple substantially trapezoidal sectional shape, it is possible to improve the distribution of generated heat.

Figure 2G:
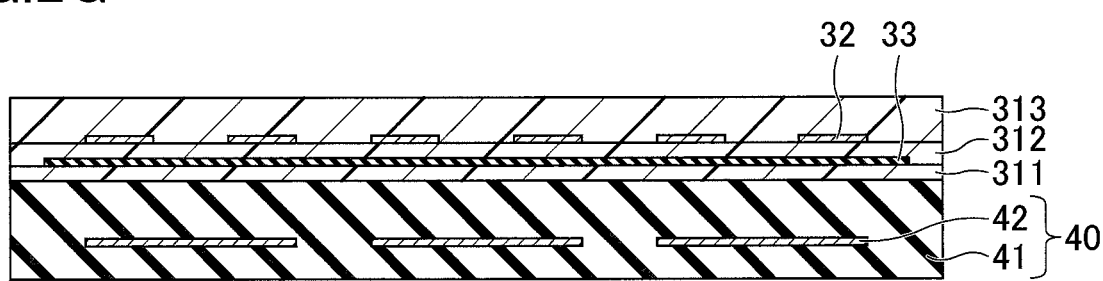

Next, in the process depicted in FIG. 2G, the insulating resin film 312 is laminated with an insulating resin film 313 that covers the heating element 32. It is preferable to laminate the insulating resin film 312 with the insulating resin film 313 in a vacuum in that it is possible to prevent inclusion of voids. The material of the insulating resin film 313 may be the same as the material of the insulating resin film 311, for example. The thickness of the insulating resin film 313, however, which may be suitably determined within a range that makes it possible to cover the heating element 32, does not necessarily have to be the same as the thickness of the insulating resin film 311 or 312.

Figure 2H:
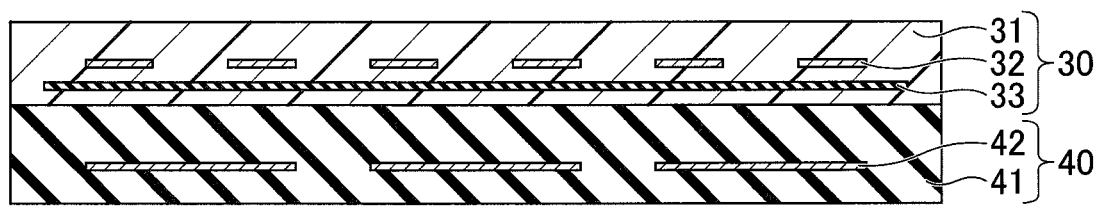

Next, in the process depicted in FIG. 2H, the insulating resin films 311, 312 and 313 are heated to or above a curing temperature to be cured while being pressed toward the electrostatic chuck 40. As a result, the insulating resin films 311, 312 and 313 are combined together as one piece into the insulating layer 31. Consequently, the heating part 30 in which the heating element 32 and the metal layer 33 are surrounded and covered by the insulating layer 31 is formed, and the insulating layer 31 of the heating part 30 and the electrostatic chuck 40 are directly bonded. It is preferable to heat the insulating resin films 311, 312 and 313 at or below 200° C. in view of stress caused when the temperature returns to normal temperature.

By heating and curing the insulating resin films 311, 312 and 313 while pressing the insulating resin films 311, 312 and 313 against the electrostatic chuck 40, it is possible to flatten the upper surface (surface opposite from a surface that contacts the electrostatic chuck 40) of the insulating layer 31 by reducing irregularities in the upper surface due to the presence or absence of the heating element 32. The size of irregularities in the upper surface of the insulating layer 31 is preferably 7 μm or less. By causing the size of irregularities in the upper surface of the insulating layer 31 to be 7 μm or less, it is possible to prevent air bubbles from being caught between the insulating layer 31 and the adhesive layer 20 in the subsequent process. That is, it is possible to prevent a decrease in the adhesion between the insulating layer 31 and the adhesive layer 20.

Figure 2I:
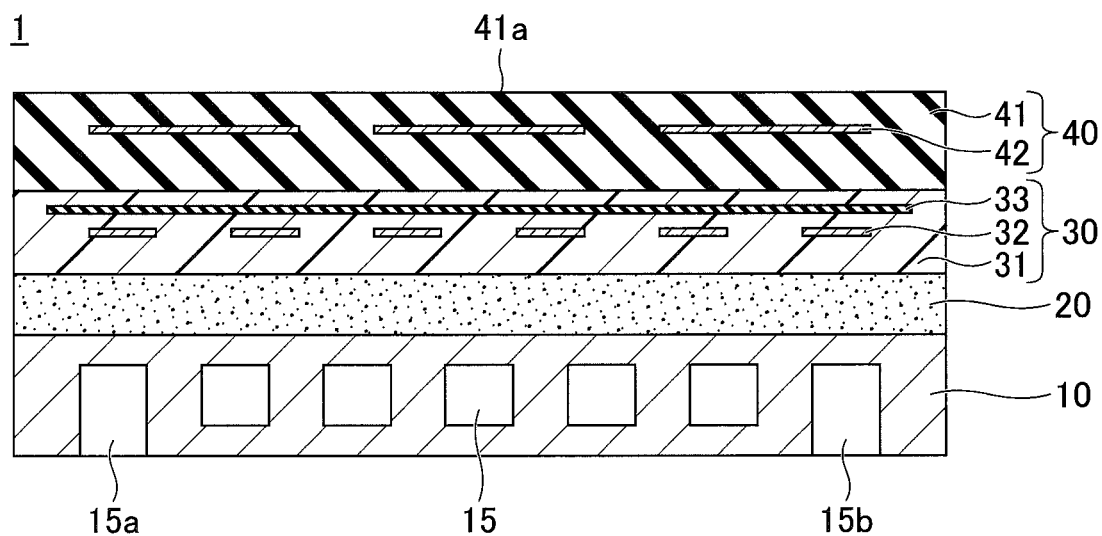

Next, in the process depicted in FIG. 2I, the baseplate 10 in which the water conduit 15, etc., are preformed is prepared, and the adhesive layer 20 (uncured) is formed on the baseplate 10. Then, the structure depicted in FIG. 2H is inverted to be placed on the baseplate 10 through the adhesive layer 20, and the adhesive layer 20 is cured. As a result, the substrate fixing device 1 in which the heating part 30 and the electrostatic chuck 40 are successively stacked in this order on the baseplate 10 through the adhesive layer 20 is completed. In the case of manufacturing the substrate fixing device 1 of FIG. 5A, the process of FIGS. 2C and 2D may be repeated before the process of FIG. 2E. In the case of manufacturing the substrate fixing device 1 of FIG. 5B, the process of FIGS. 2B and 2C may be repeated after the process of FIG. 2F, and thereafter, in the process of FIG. 2G, the insulating resin film 311 may be laminated with the insulating resin film 313 that covers the metal layer 33.

Figure 3A:
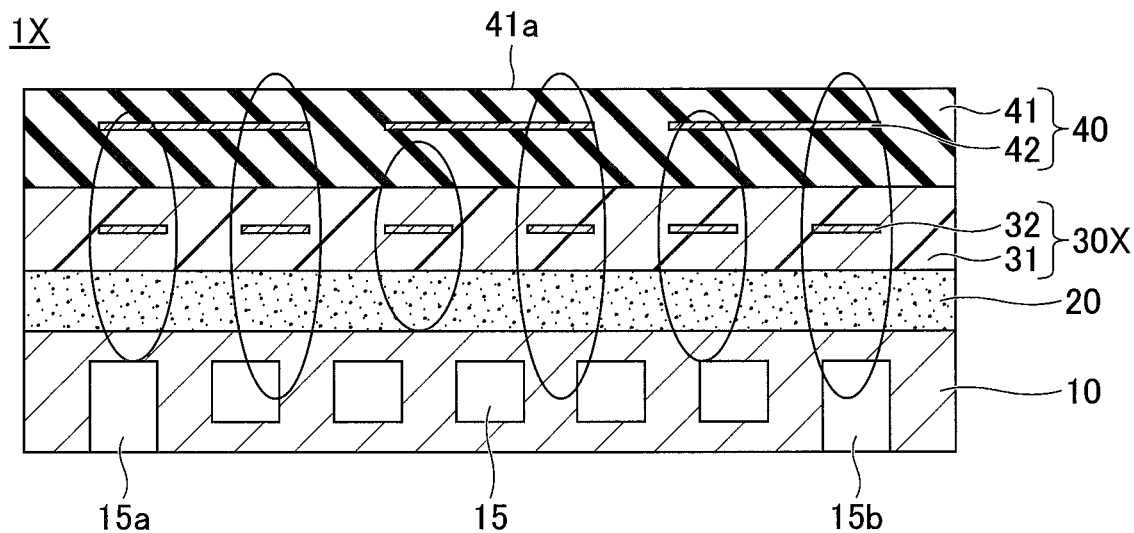
FIGS. 3A and 3B are diagrams illustrating an effect produced by the substrate fixing device.
Figure 3B:
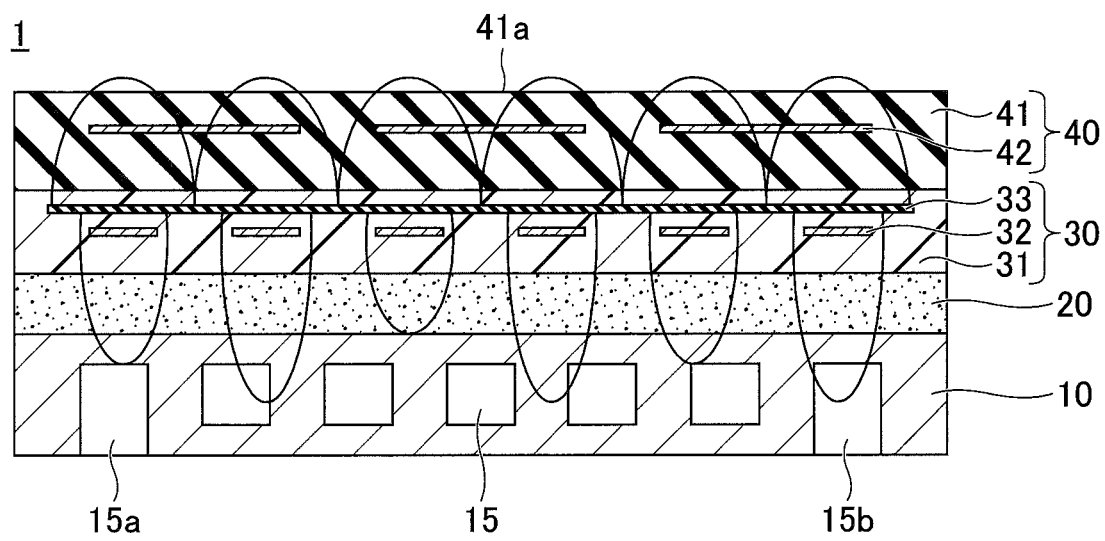

Here, an effect produced by the substrate fixing device 1 is described with reference to a comparative example. FIGS. 3A and 3B are diagrams for illustrating an effect produced by the substrate fixing device 1. FIG. 3A schematically illustrates the spreading of heat generated by the heating element 32 in a substrate fixing device 1X according to a comparative example, using ellipses. FIG. 3B schematically illustrates the spreading of heat generated by the heating element 32 in the substrate fixing device 1 according to the embodiment, using ellipses.

A heating part 30X of the substrate fixing device 1X illustrated FIG. 3A does not include the metal layer 33, and therefore cannot uniformize and diffuse heat generated by the heating element 32. Therefore, when there is a factor that impairs uniformity in the heat generated by the heating element 32, the temperature of the placement surface 41a of the substrate 41 does not become uniform.

In contrast, the heating part 30 of the substrate fixing device 1 illustrated FIG. 3B includes the metal layer 33. As a result, even when there is a factor that impairs uniformity in the heat generated by the heating element 32, the metal layer 33 uniformizes and diffuses the heat generated by the heating element 32 (reduces non-uniform heat generation). Therefore, it is possible to improve the uniformity of the temperature of the placement surface 41a of the substrate 41.

Variations of First Embodiment

Variations of the pattern of the metal layer 33 are illustrated below. In the following, the same elements or components as those of the above-described embodiment are referred to using the same reference numeral, and duplicate description thereof may be omitted.

FIGS. 4A through 4F are diagrams illustrating variations of the pattern of the metal layer 33 provided in the heating part 30. According to the above-described embodiment, the metal layer 33 is illustrated as having a solid pattern having a circular planar shape. The metal layer pattern, however, is not limited to a solid pattern. For example, the metal layer may have any of the various types of patterns as illustrated in FIGS. 4A through 4F or a desired pattern other than the illustrated patterns.

Figure 4A:
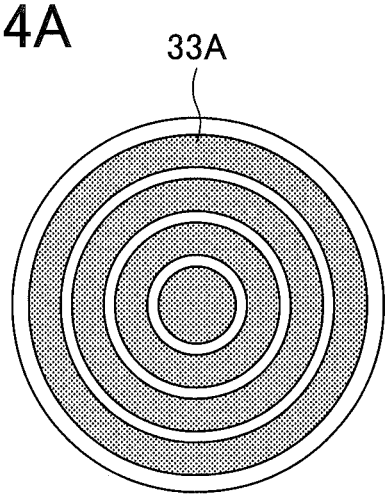
FIGS. 4A through 4F are diagrams illustrating variations of the pattern of a metal layer provided in a heating part.

A metal layer 33A illustrated in FIG. 4A has a concentric circle pattern. A metal layer 33B illustrated in FIG. 4B has a spiral pattern. A metal layer 33C illustrated FIG. 4C has the concentric circle pattern illustrated in FIG. 4A with a substantially cross-shaped slit. A metal layer 33D illustrated in FIG. 4D has the concentric circle pattern illustrated in FIG. 4B with a substantially cross-shaped slit. A metal layer 33E illustrated in FIG. 4E has a mesh pattern. A metal layer 33F illustrated in FIG. 4F has a block tile pattern.

By thus causing the metal layer provided in the heating part 30 to have a pattern of a predetermined shape including a first portion and a second portion adjacent to each other across a gap instead of a solid pattern, it is possible to reduce the warpage of the electrostatic chuck 40 due to a difference in the coefficient of thermal expansion between the metal layer and another part.

Figure 4B:
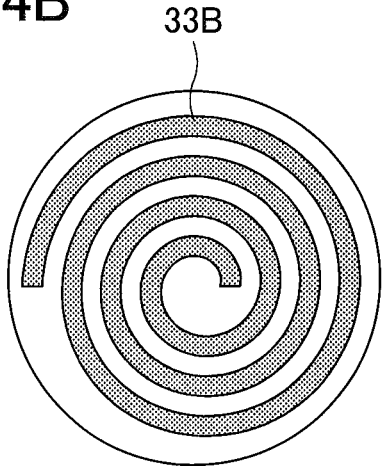
Figure 4C:
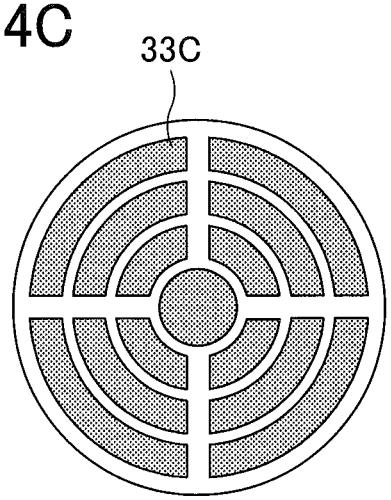
Figure 4D:
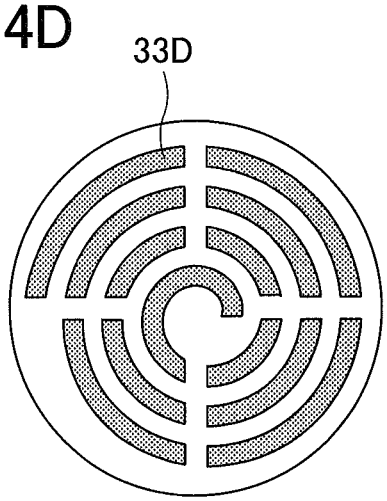
Figure 4E:
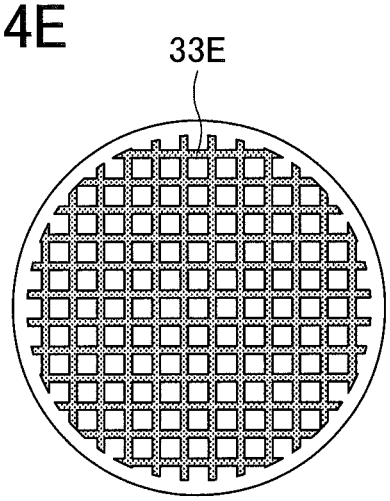
Figure 4F:
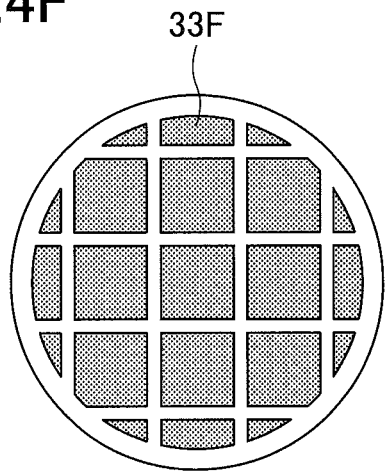

In particular, when the heating element 32 has a concentric circle pattern, it is possible to efficiently diffuse heat generated by the heating element 32 by causing the metal layer provided in the heating part 30 to have a concentric circle pattern as illustrated in FIG. 4A or a spiral pattern as illustrated in FIG. 4B.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, examples of objects to be attracted and held by a substrate fixing device according to embodiments of the present invention include, in addition to semiconductor wafers (such as silicon wafers), glass substrates used in the process of manufacturing, for example, liquid crystal panels.

What is claimed is:

1. A substrate fixing device comprising:
a baseplate;
an insulating layer formed of resin over the baseplate, the insulating layer including
   a heating element; and
   a metal layer having a higher thermal conductivity than the insulating layer; and
an electrostatic chuck on a first surface of the insulating layer, the electrostatic chuck including
   a substrate formed of ceramic; and
   an electrostatic electrode buried in the substrate,
wherein the heating element and the metal layer are positioned between the first surface and a second surface of the insulating layer, the second surface being on an opposite side from the first surface, and the metal layer is positioned between the first surface of the insulating layer and the heating element in the insulating layer.

2. The substrate fixing device as claimed in claim 1, wherein the metal layer has a pattern of a predetermined shape that includes a first portion and a second portion adjacent to each other across a gap.

3. The substrate fixing device as claimed in claim 2, wherein the pattern of the predetermined shape is a concentric circle pattern or a spiral pattern.

4. The substrate fixing device as claimed in claim 3, wherein the heating element has a concentric circle pattern.

5. The substrate fixing device as claimed in claim 1, wherein the heating element and the metal layer are formed of a same material.

6. The substrate fixing device as claimed in claim 1, wherein a planar shape of the metal layer is larger than a planar shape of the heating element.

7. The substrate fixing device as claimed in claim 1, wherein the insulating layer further includes another metal layer having a higher thermal conductivity than the insulating layer.

8. The substrate fixing device as claimed in claim 7, wherein said another metal layer is positioned closer to the electrostatic chuck than the metal layer.

9. The substrate fixing device as claimed in claim 7, wherein said another metal layer is positioned closer to the baseplate than the heating element.

10. The substrate fixing device as claimed in claim 1, wherein a first surface of the metal layer facing toward the electrostatic chuck, a second surface of the metal layer facing toward the baseplate, and a side surface of the metal layer connecting the first surface and the second surface of the metal layer are covered with the insulating layer.

11. The substrate fixing device as claimed in claim 1, wherein the resin is an epoxy resin or a bismaleimide-triazine resin.

12. The substrate fixing device as claimed in claim 1, wherein the electrostatic electrode includes a plurality of non-continuous segments.

* * * * *